United States Patent
Hashimoto

(10) Patent No.: US 8,361,240 B2
(45) Date of Patent: Jan. 29, 2013

(54) SUBSTRATE PROCESSING APPARATUS AND SUBSTRATE PROCESSING METHOD

(75) Inventor: Yukihiro Hashimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1065 days.

(21) Appl. No.: 11/902,394

(22) Filed: Sep. 21, 2007

(65) Prior Publication Data
US 2008/0078425 A1    Apr. 3, 2008

(30) Foreign Application Priority Data
Sep. 29, 2006   (JP) ................... 2006-268881

(51) Int. Cl.
*B08B 3/00* (2006.01)
*B08B 7/04* (2006.01)

(52) U.S. Cl. .............. 134/26; 134/25.1; 134/31; 134/37

(58) Field of Classification Search ........................ None
See application file for complete search history.

(56) References Cited

U.S. PATENT DOCUMENTS

| | | | | |
|---|---|---|---|---|
| 4,983,254 A | * | 1/1991 | Fujimura et al. | 216/67 |
| 6,036,581 A | * | 3/2000 | Aoki | 451/39 |
| 6,299,696 B2 | * | 10/2001 | Kamikawa et al. | 134/2 |
| 6,325,854 B1 | * | 12/2001 | Murata et al. | 118/629 |
| 6,699,330 B1 | * | 3/2004 | Muraoka | 134/3 |

FOREIGN PATENT DOCUMENTS

| | | |
|---|---|---|
| JP | 56-60021 A | 5/1981 |
| JP | 02-117133 A | 5/1990 |
| JP | 03-241742 A | 10/1991 |
| JP | 04-369221 A | 12/1992 |
| JP | 8-197418 A | 8/1996 |
| JP | 10-326763 A | 12/1998 |
| JP | 2001-276758 A | 10/2001 |
| JP | 2005-175053 A | 6/2005 |
| JP | 2006-054344 A | 2/2006 |

OTHER PUBLICATIONS

Japanese Office Action dated Jan. 25, 2011, issued in corresponding Japanese Patent Application No. 2006-268881.
"Japanese Office Action" mailed by JPO and corresponding to Japanese application No. 2006-268881 on Aug. 23, 2011, with partial English translation.

* cited by examiner

*Primary Examiner* — Michael Kornakov
*Assistant Examiner* — Nicole Blan
(74) *Attorney, Agent, or Firm* — Fujitsu Patent Center

(57) ABSTRACT

A substrate processing apparatus includes liquid tanks, a conveyor mechanism that dips multiple semiconductor substrates, arranged with provision of spaces, collectively into liquids in the liquid tanks, and water vapor spray nozzles disposed in gaps between the multiple semiconductor substrates so as to face rear surfaces of the semiconductor substrates. Heated water vapor is sprayed out of the water vapor spray nozzles onto the respective rear surfaces of the multiple semiconductor substrates prior to dipping the semiconductor substrates into the liquid in the liquid tanks.

8 Claims, 14 Drawing Sheets

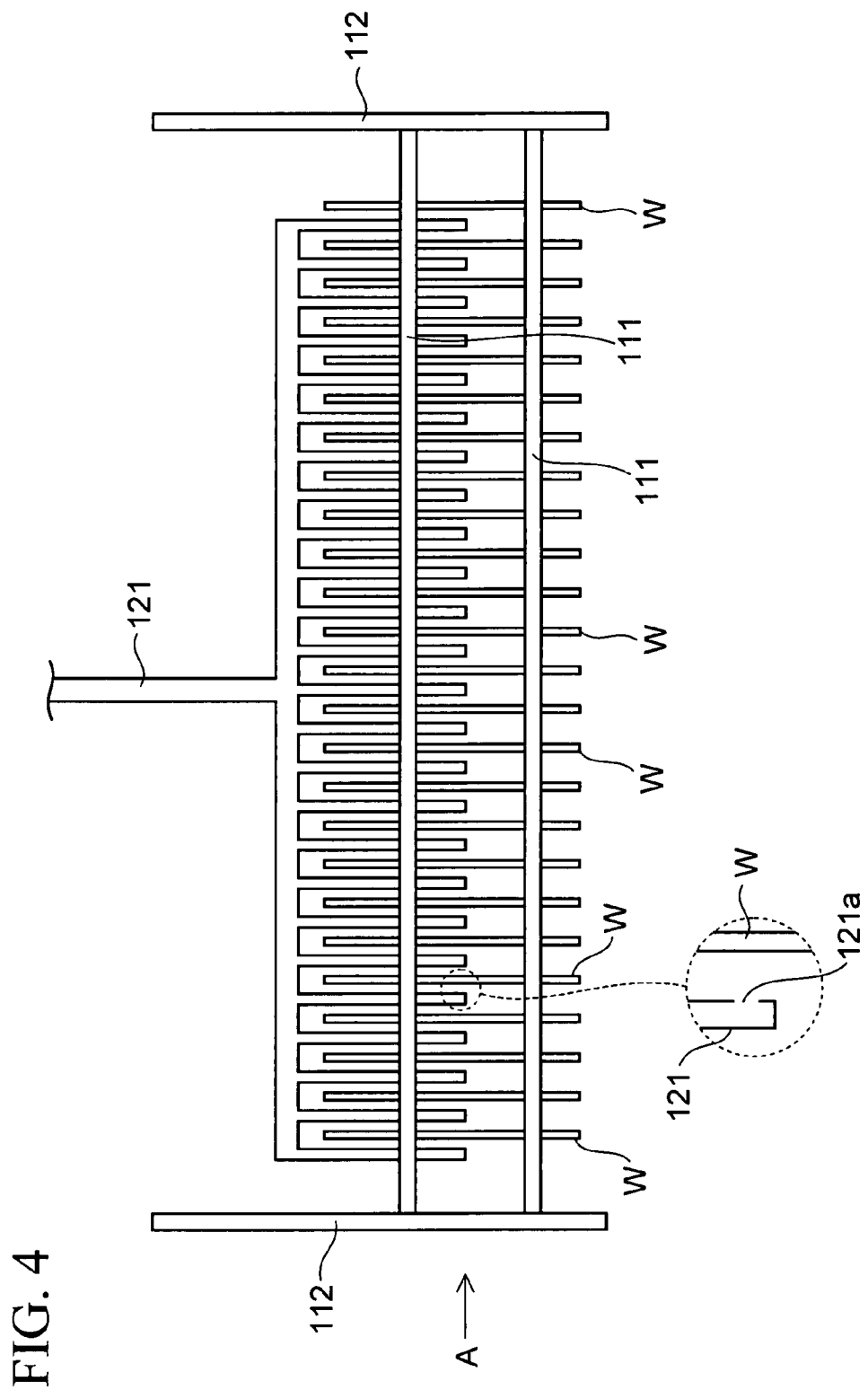

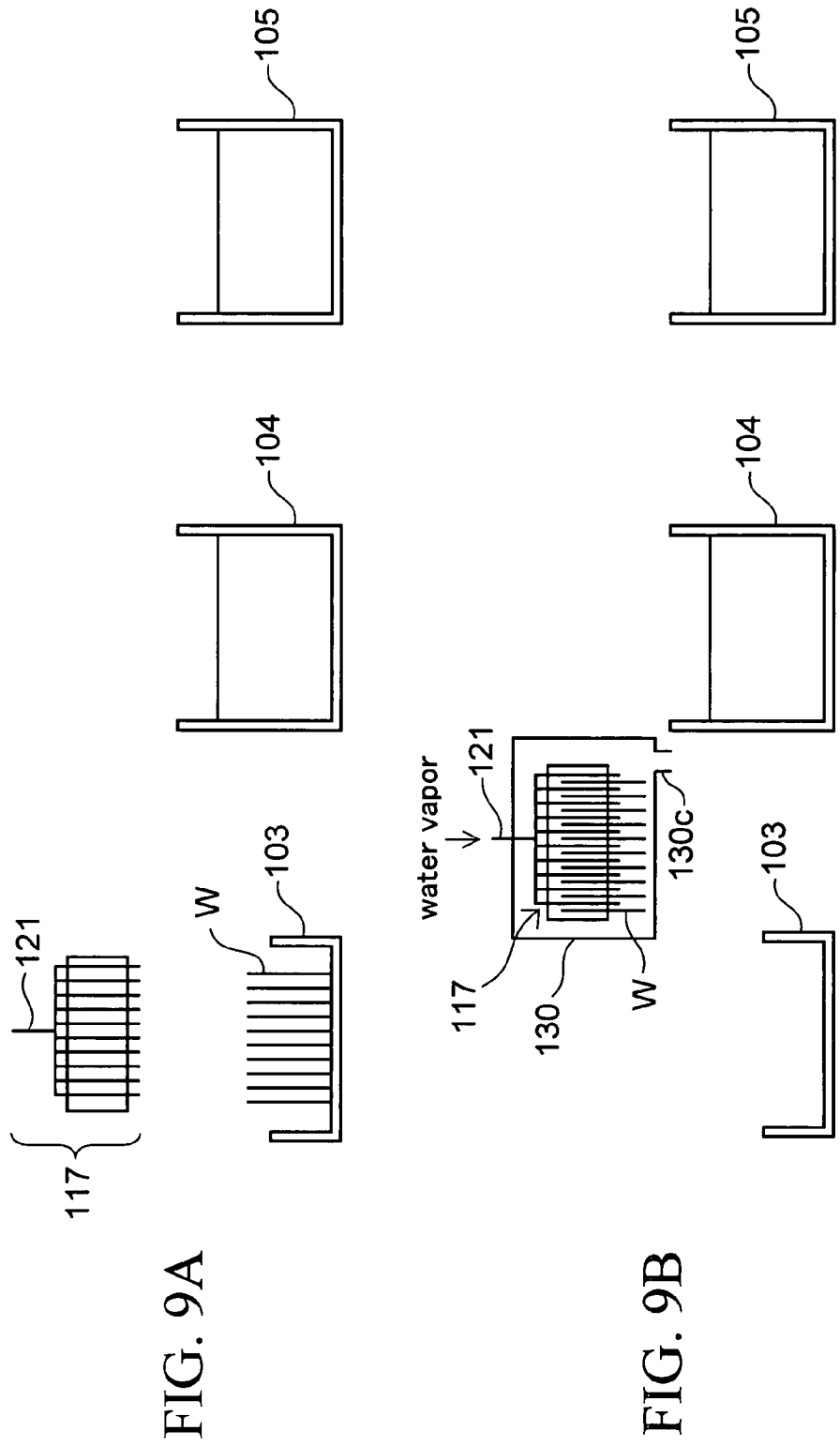

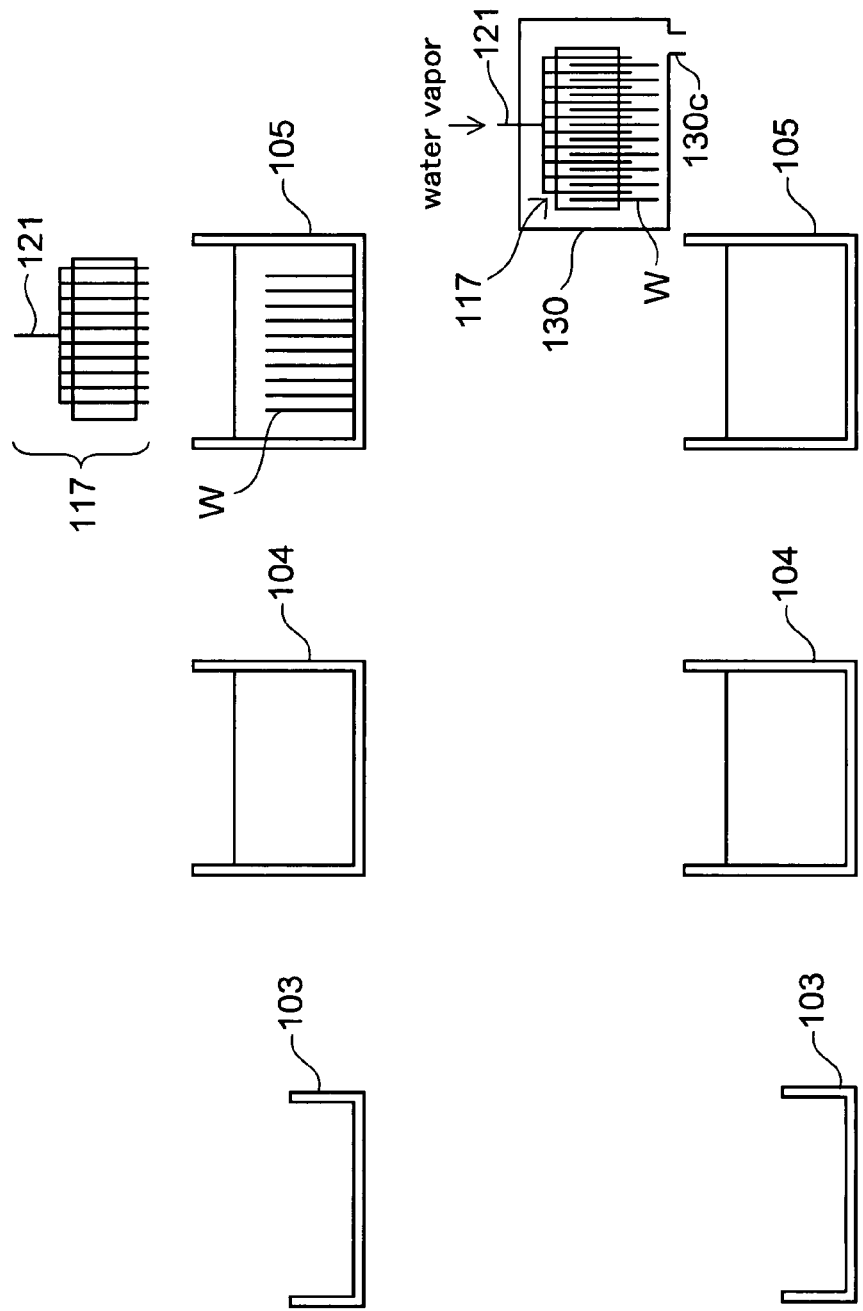

SUBSTRATE PROCESSING APPARATUS AND SUBSTRATE PROCESSING METHOD

CROSS-REFERENCE TO RELATED APPLICATIONS

This application is based on and claims priority of Japanese Patent Application No. 2006-268881 filed on Sep. 29, 2006, the entire contents of which are incorporated herein by reference.

BACKGROUND

1. Field

The embodiments discussed herein are directed to a substrate processing apparatus and a substrate processing method.

2. Description of the Related Art

In a manufacturing process of a semiconductor device such as a large-scale integrated circuit (LSI), a semiconductor substrate undergoes a cleaning process in order to remove a native oxide film formed on a surface of the semiconductor substrate, or to remove photoresist residues. A substrate processing apparatus used in the cleaning process is roughly categorized into a batch-type apparatus and a sheet-type apparatus. From a viewpoint of obtaining higher throughput, the batch-type apparatus capable of cleaning multiple semiconductor substrates in one cleaning session is more advantageous than the sheet-type apparatus configured to process the semiconductor substrates individually.

Nevertheless, since the multiple semiconductor substrates are dipped in a single liquid tank in the case of the batch-type apparatus, there is a problem that particles formerly attached to a rear surface of a certain semiconductor substrate get attached to a front surface (a circuit formation surface) of another semiconductor. Such a problem is called backside transfer of particles, which is responsible for a reduction in the yield of semiconductor devices. Particularly, along with miniaturization of semiconductor devices in recent years, the allowable size of particles is becoming smaller every year. Today, the allowable value of particles, which may float in a liquid tank, is equal to or below 0.1 µm.

To prevent such backside transfer of particles as much as possible, the batch-type substrate processing apparatus includes a foreign substance removal mechanism called a CRS (chemical recovery system). The CRS is integrally formed by a filter for filtering particles and a circulation pump. This mechanism can circulate a liquid in the liquid tank and, at the same time, can filter the particles in the liquid. Thus, it is possible to reduce the number of particles that are peeled off from the rear surfaces of the semiconductor substrates and are floating in the liquid.

However, even though the CRS is provided therein, a long period of time is required for reducing the number of particles in the liquid tank to an allowable level, if a lot of particles are brought into the liquid tank at a time. In this case, the throughput of the substrate processing apparatus is considerably decreased.

To deal with this case, for each of the liquid tanks, limits are currently set as to how many times the processing can be performed, or how much time it can take. In a case where the processing exceeds the limits, the liquid is replaced so as to prevent the decrease in the throughput. However, when the liquid is frequently replaced in this manner, there arises another problem of an increase in usage of the liquid, which leads to an increase in the cleaning cost in the batch-type substrate processing apparatus.

Meanwhile, there is also a case where a spin-scrubber process is performed prior to processing the substrate with the substrate processing apparatus, so that the number of particles which are brought into the liquid tank is reduced. However, this process causes another problem of an increase in the manufacturing cost of the semiconductor device which is relevant to the spin-scrubber process.

Some techniques related to the present invention are disclosed in Japanese Unexamined Patent Application Publication No. 56 (1981)-60021, Japanese Patent Application Laid-open Publication No. Hei 8 (1996)-197418 and Japanese Patent Application Laid-open Publication No. 2005-175053.

SUMMARY

It is an aspect of the embodiments discussed herein to provide a substrate processing apparatus including a liquid tank, a conveyor mechanism configured to dip a plurality of substrates collectively into a liquid in the liquid tank, where the substrates being arranged at a distance from each other, and vapor spray nozzles disposed in gaps between the plurality of substrates so as to face rear surfaces of the substrates, wherein heated vapor is sprayed out of the vapor spray nozzles onto the respective rear surfaces of the plurality of substrates prior to dipping the substrates into the liquid in the liquid tank.

BRIEF DESCRIPTION OF THE DRAWINGS

FIG. 4 is a side view of a gripper included in the conveyor mechanism shown in FIG. 3.

FIGS. 9A to 9F are schematic views for explaining a substrate processing method according to the embodiment, which are arranged in the order of steps.

DESCRIPTION OF THE PREFERRED EMBODIMENTS

Now, an embodiment will be described below in detail with reference to the accompanying drawings.

Configuration of Substrate Processing Apparatus

Figure 1:
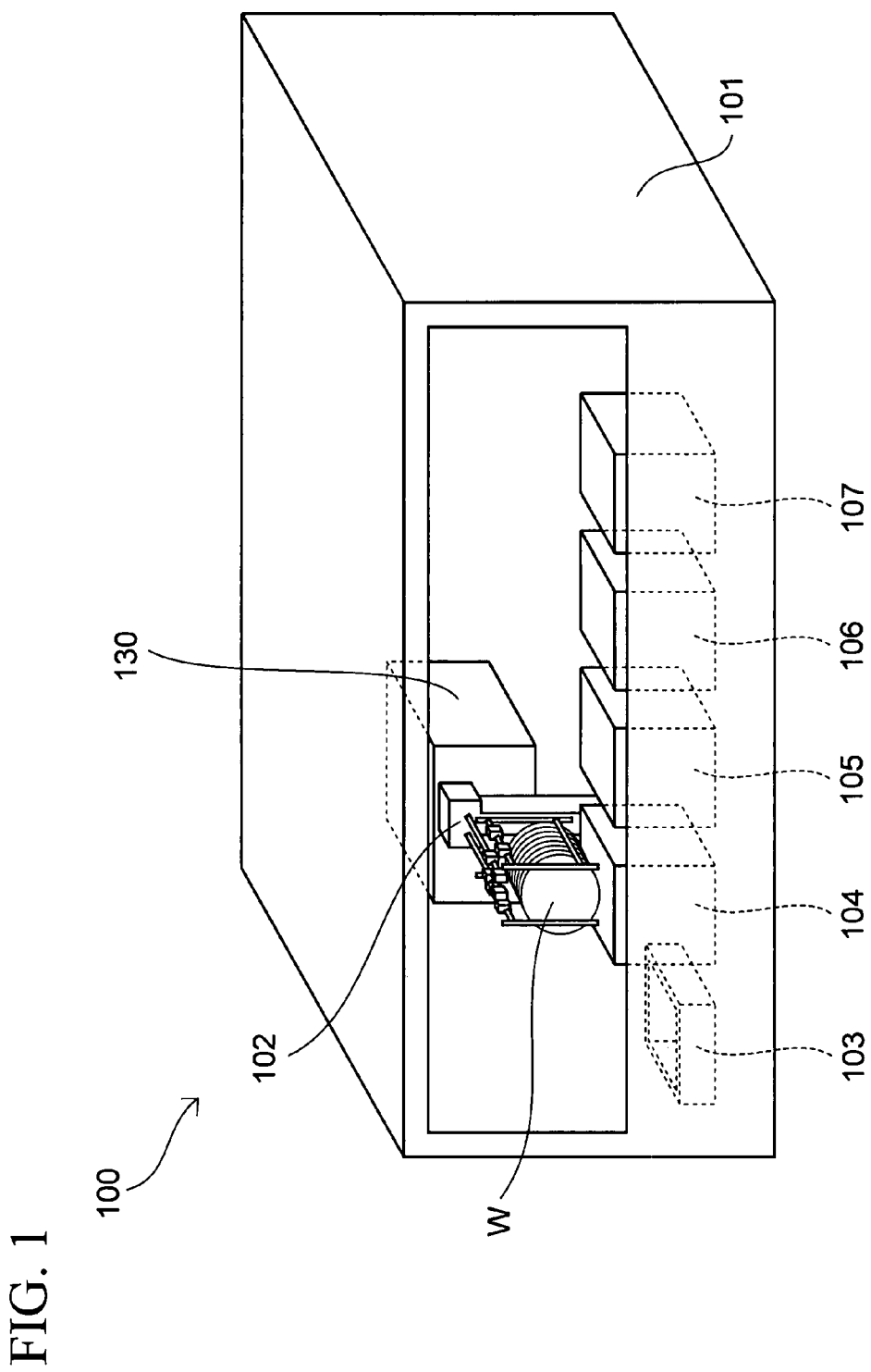
FIG. 1 is an overall perspective view of a substrate processing apparatus according to an embodiment.

FIG. 1 is an overall perspective view of a substrate processing apparatus 100 according to an embodiment.

This substrate processing apparatus 100 is a batch-type apparatus capable of processing multiple silicon substrates W for semiconductor devices in one cleaning session. The substrate processing apparatus 100 includes a conveyor mechanism 102 for conveying the silicon substrates, a load stage 103, first to fourth liquid tanks 104 to 107, and an openable-closable container 130, all of which are housed in a housing 101.

Among them, the multiple silicon substrates W are subject to cleaning after completion of an exposure process, or the like. These are placed on the load stage 103 on the lot units.

Meanwhile, deionized water and chemical solutions are stored in the first to fourth liquid tanks 104 to 107 in an arbitrary combination. The chemical solutions used herein include a mixed solution composed of sulfuric acid and aqueous hydrogen peroxide (such a solution will be hereinafter referred to as sulfuric acid peroxide mixture or SPM), or a hydrofluoric acid aqueous solution, for example. Among them, the SPM is useful for dissolving photoresist residues and heavy metals on surfaces of the silicon substrates. Meanwhile, the hydrofluoric acid aqueous solution is useful for dissolving native oxide films that are formed on the surfaces of the silicon substrates. Moreover, the deionized water is used as a rinse fluid for rinsing off these chemical solutions.

The arrangement of storage of the deionized water and the chemical solutions in the liquid tanks is not particularly limited. In this embodiment, the deionized water is stored in the second and fourth liquid tanks 105 and 107, for example. Meanwhile, the SPM is stored in the first liquid tank 104 and the hydrofluoric acid aqueous solution is stored in the third liquid tank 106.

Figure 2:
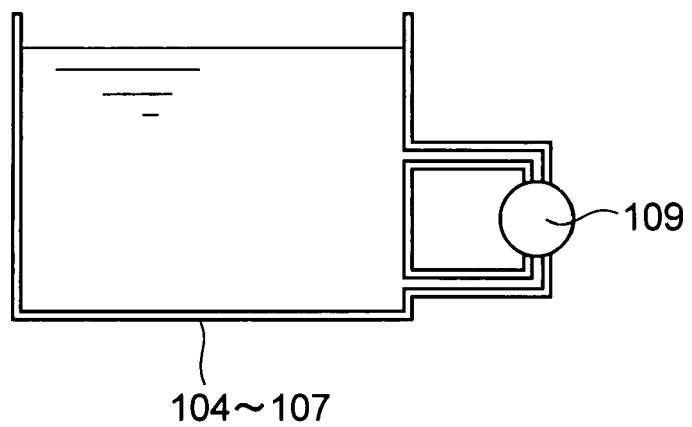
FIG. 2 is a cross-sectional view of each tank included in the substrate processing apparatus according to the embodiment.

FIG. 2 is a cross-sectional view of each of the liquid tanks 104 to 107.

As shown in the drawing, each of the liquid tanks 104 to 107 is provided with a chemical solution recovery system (CRS, functioning as a foreign substance removal mechanism) 109. The CRS 109 includes a pump and a filter and has a function to filter particles with the filter while constantly circulating the liquid inside the liquid tank with the pump.

Figure 3:
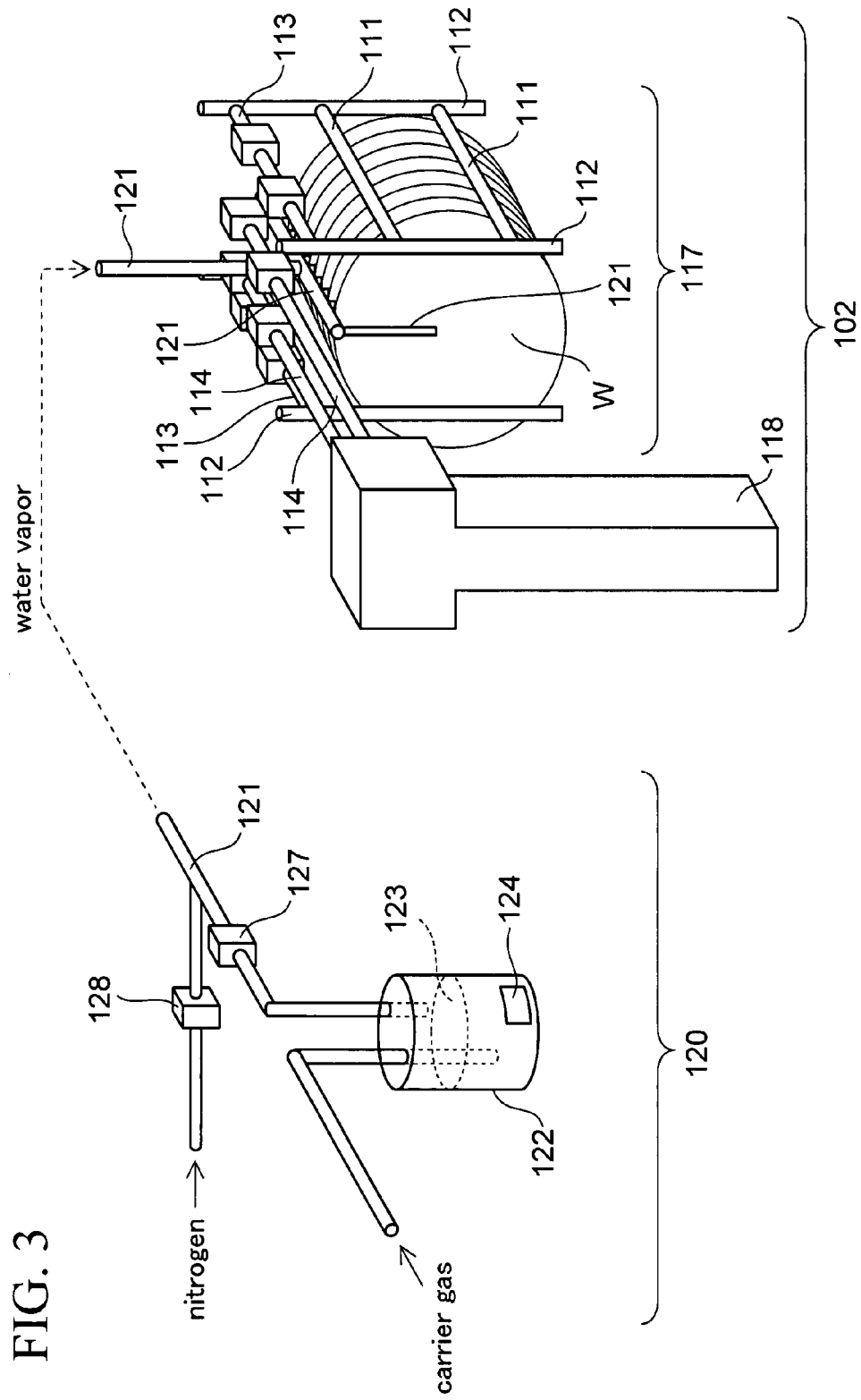
FIG. 3 is a perspective view of a conveyor mechanism included in the substrate processing apparatus according to the embodiment.

FIG. 3 is a perspective view of the conveyor mechanism 102.

The conveyor mechanism 102 essentially includes a gripper 117 and an arm 118.

Of these components, the gripper 117 includes multiple horizontal guide rods 111. The multiple silicon substrates W, arranged at a distance from each other, are gripped sideways by the respective guide rods 111. By gripping the silicon substrates W sideways, it is possible to reduce contact areas of the respective guide rods 111 and the silicon substrates W and thereby to minimize particles to be transferred from the guide rods 111 to the silicon substrates W.

Moreover, these guide rods 11 are mechanically connected to the arm 118 through vertical connecting rods 112 and first and second horizontal connecting rods 113 and 114.

A water vapor pipe 121 connected to a water vapor generator 120 is disposed in gaps between the mutually adjacent silicon substrates W. The water vapor pipe 121 is provided on the conveyor mechanism 102.

Moreover, in the water vapor generator 120, deionized water 123 stored in a quartz crucible 122 is heated to a temperature approximately in a range from 80° C. to 100° C. by a heater 124. Water vapor is then supplied to the water vapor pipe 121 by means of bubbling carrier gas such as nitrogen gas.

Here, valves 127 and 128 are provided in the middle of the water vapor pipe 121. It is also possible to supply dry nitrogen to the water vapor pipe 121 by switching these valves.

FIG. 4 is a side view of the gripper 117.

As shown in the drawing, the water vapor pipe 121 has a comb-like cross-sectional shape and includes water vapor spray nozzles 121a on tip ends thereof so as to face rear surfaces of the silicon substrates W. In this specification, the rear surface of the silicon substrate W means one of the two principal surfaces of the substrate W where circuit elements such as transistors are not formed.

FIGS. 5A to 5D are views showing various examples of the shape of a tip end portion of the water vapor pipe 121, which correspond to the views of the pipe 121 from a direction of an arrow A in FIG. 4.

Figure 5A:
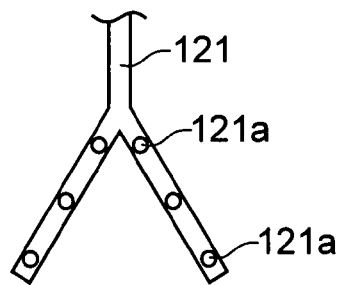
FIGS. 5A to 5D are views showing various examples of a shape of a tip end portion of a water vapor pipe included in the substrate processing apparatus according to the embodiment.
Figure 5B:
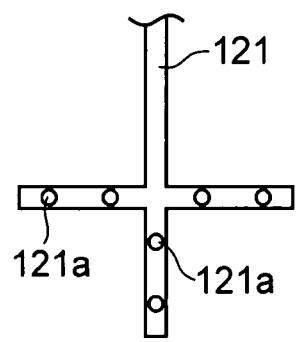

The water vapor pipe 121 is split into two branches in the example of FIG. 5A whereas the water vapor pipe 121 is split into three branches in the example of FIG. 5B. The nozzles 121a are formed on the respective branch pipes therein.

Figure 5C:
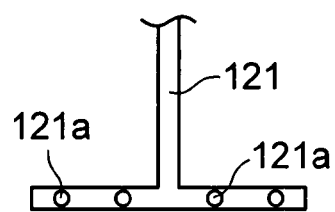
Figure 5D:
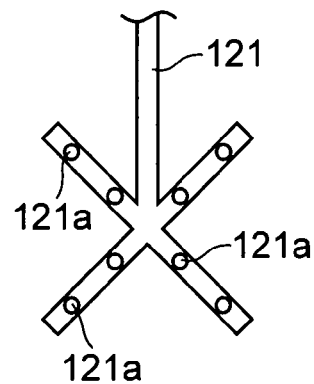

The example of FIG. 5C illustrates the pipe 121 that is split into two horizontal branches. Meanwhile, the example of FIG. 5D illustrates the pipe 121 that is split into four branches.

This embodiment may apply any type of the water vapor pipes 121 illustrated in FIGS. 5A to 5D.

Figure 6:
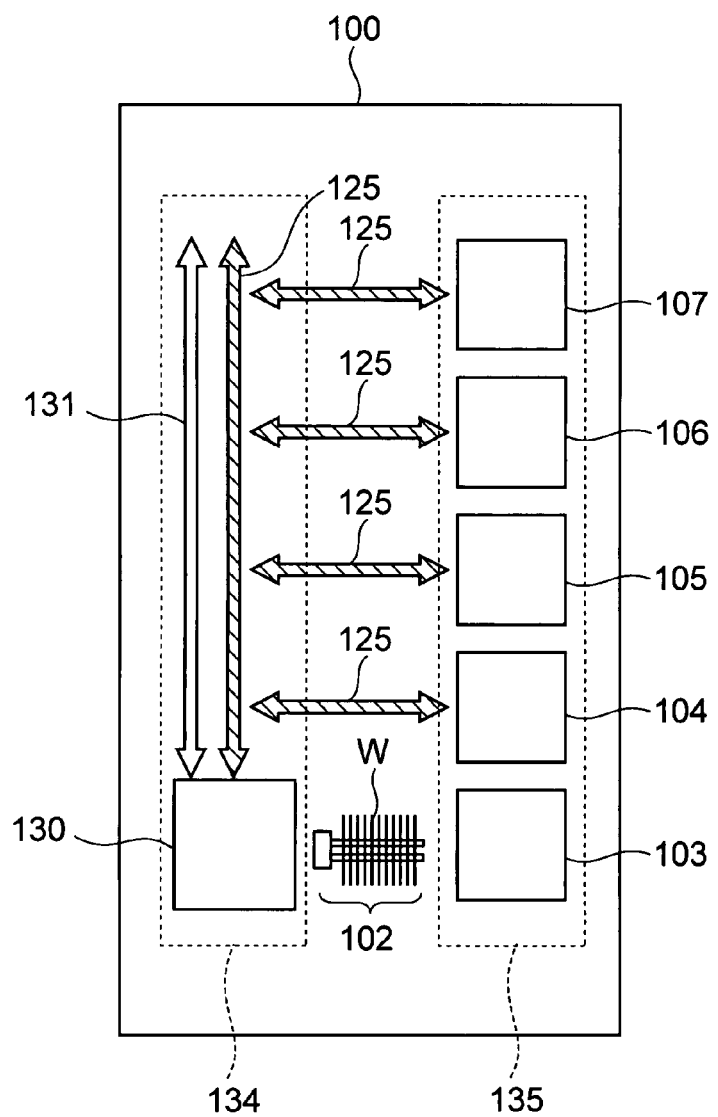
FIG. 6 is a top view of the substrate processing apparatus according to the embodiment.

FIG. 6 is a top view of this substrate processing apparatus 100.

In the drawings, motions of the conveyor mechanism 102 are indicated with arrows 125 and motions of the container 130 are indicated with an arrow 131.

Before or after a process on the silicon substrates W, the conveyor mechanism 102 is in a stand-by state in a stand-by area 134 and is housed in the container 130.

Thereafter, when performing the processes on the silicon substrates W in the liquid tanks 104 to 107, the conveyor mechanism 102 comes out of the container 130 and moves to a process area 135, and then conveys the multiple silicon substrates W collectively to the respective liquid tanks 104 to 107.

Meanwhile, in the case of moving to and from the respective liquid tanks 104 to 107, the conveyor mechanism 102 moves within the stand-by area 134 together with the container 130.

Figure 7:
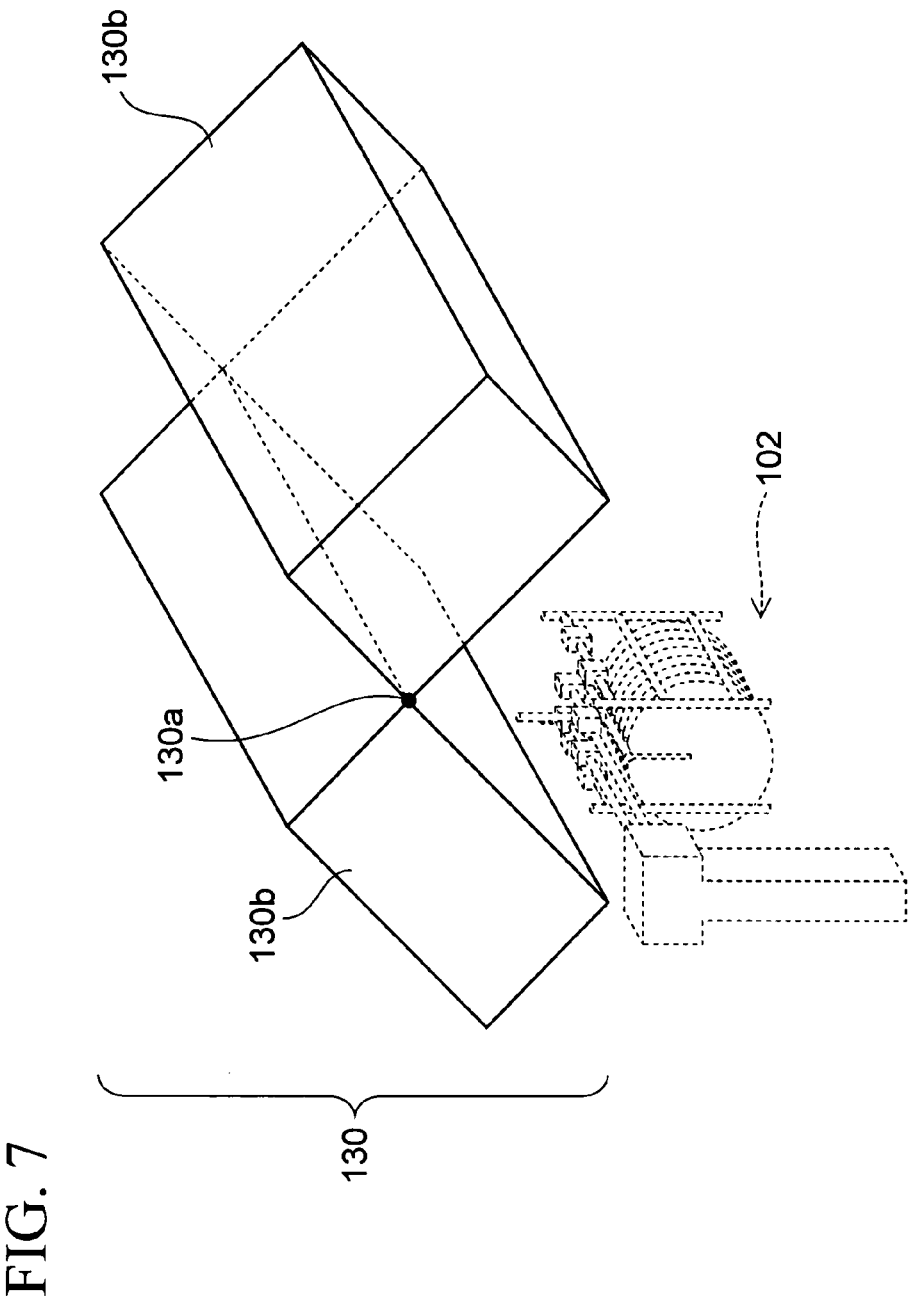
FIG. 7 is a perspective view of a container included in the substrate processing apparatus according to the embodiment.

FIG. 7 is a perspective view of the container 130.

The container 130 applies a structure in which two covers 130b can be opened or closed pivotally around a hinge 130a. The respective covers 130b are closed when housing the conveyor mechanism 102, thereby hermetically shielding the inside. Meanwhile, when the conveyor mechanism 102 moves to the process area 135, the respective covers 130b are opened so that the conveyor mechanism 102 comes out of the container 130.

Figure 8:
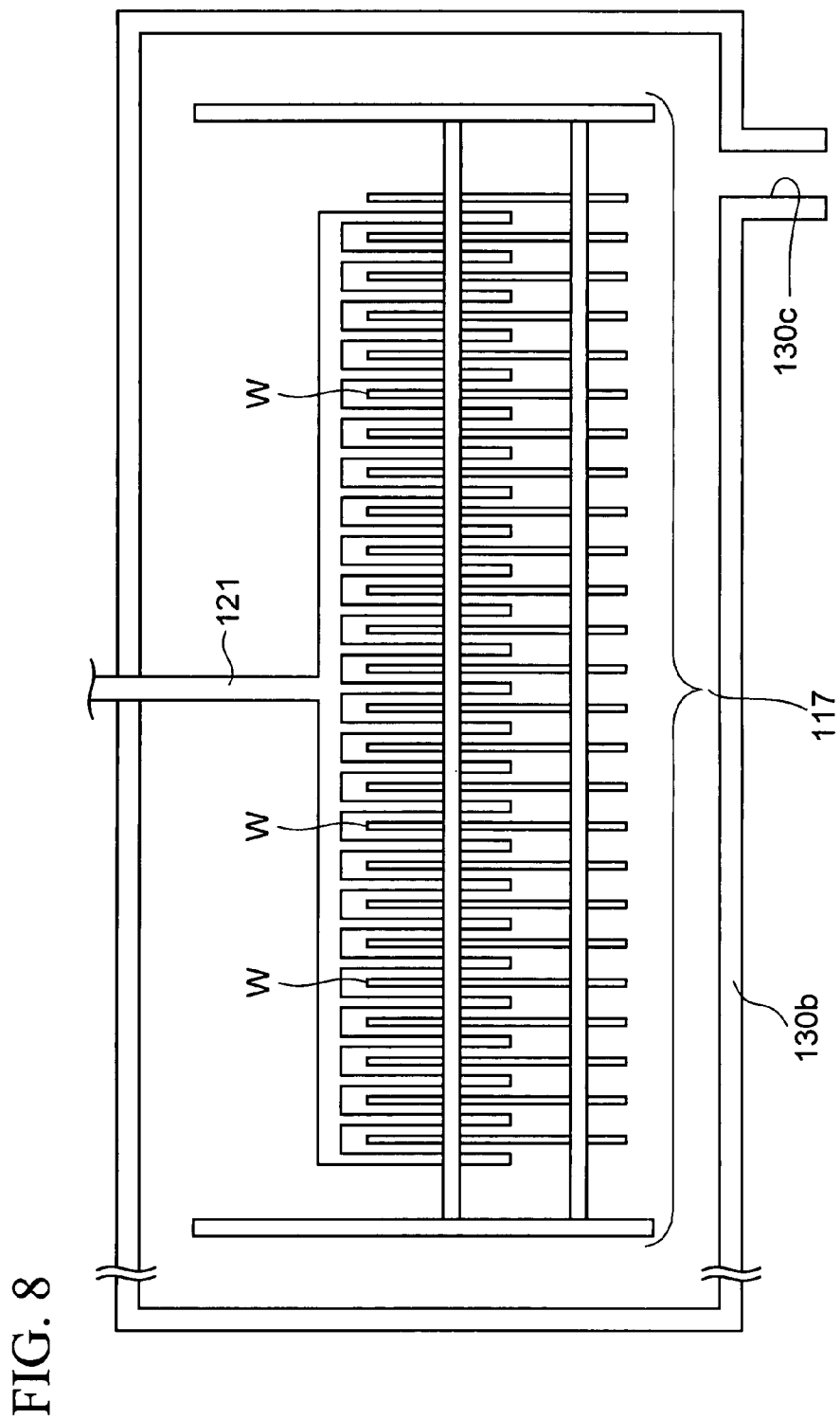
FIG. 8 is a cross-sectional view of the container in the state of housing the gripper.

FIG. 8 is a cross-sectional view of the container 130 in the state of housing the conveyor mechanism 102.

A drain outlet 130c is provided at the bottom of the cover 130b constituting the container 130. The water vapor sprayed onto the semiconductor substrates W and thereby liquefied is drained from the drain outlet 130c to the outside.

Substrate Processing Method

Next, a substrate processing method using the above-described substrate processing apparatus 100 will be described.

FIGS. 9A to 9F are schematic views for explaining the substrate processing method according to the embodiment, which are arranged in the order of steps. To facilitate the explanation, only the first and second liquid tanks 104 and 105 out of the liquid tanks 104 to 107 will be used in the following description. However, in an actual manufacturing process of a semiconductor device, it is possible to use any of the liquid tanks 104 to 107 as appropriate.

In a first step shown in FIG. 9A, one lot of the silicon substrates W which are subject to cleaning after completion of an exposure process, for example, are placed on the load stage 103.

Subsequently, the respective silicon substrates W are gripped by the gripper 117 and the gripper 117 is housed in the container 130 as shown in FIG. 9B.

Here, numerous particles are attached to the rear surfaces of the silicon substrates W as a consequence of contact with a stage of a stepper used in the exposure process, for example. When the silicon substrates W are cleaned in the first liquid tank 104 with the particles attached thereto, the particles float in the liquid. As a result, the particles are attached onto the front surfaces of the silicon substrates W where circuits are formed. This reduces product yields.

To deal with this problem, the heated water vapor is sprayed out of the water vapor pipe 121 onto the rear surfaces of the silicon substrates W in this step so as to remove the particles attached onto the rear surfaces. The heated water vapor has an effective function to weaken adhesion between the particles and the silicon substrates W. Accordingly, it is not necessary to spray high-pressure water vapor. Even if the water vapor is at a relatively low flow rate, it still has a sufficient effect to remove the particles. In this embodiment, a flow rate of nitrogen, which is serving as carrier gas for the water vapor, is set in a relatively low range from 2 to 3 SLM (standard litters per minutes). A heating temperature by the heater 124 (see FIG. 3) is set in a range from 80° C. to 100° C. Moreover, process time is set approximately in a range from 10 to 20 seconds.

The water vapor sprayed is cooled down on the rear surfaces of the silicon substrates W and on an inner surface of the container 130. Subsequently, the water vapor is condensed into water droplets. The water droplets are drained outside the substrate processing apparatus through the drain outlet 130c. Therefore, the water droplets will not be spilled into the respective liquid tanks 104 and 105.

Moreover, since the water vapor is sprayed onto the silicon substrates W in the state of the gripper 117 housed in the container 130, it is possible to prevent the substrate processing apparatus 100 from being filled with the water vapor.

Figure 10:
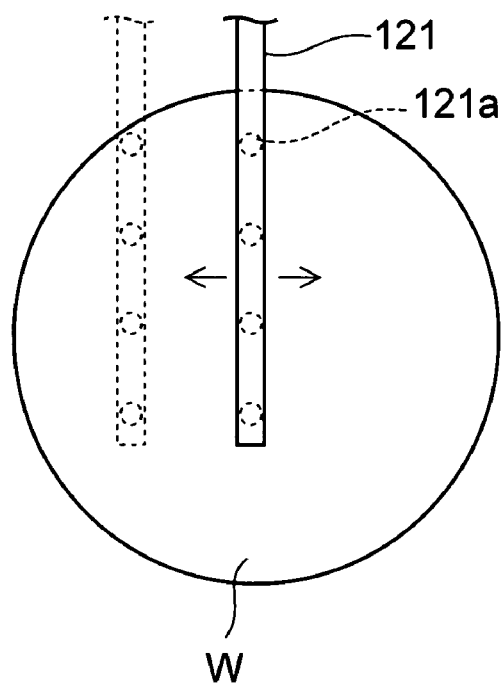
FIG. 10 is a side view showing a case of swinging a water vapor spray nozzle in the embodiment.

Here, in order to spray the water vapor uniformly onto the rear surface of the silicon substrate W, it is possible to render the water vapor pipe 121 movable as shown in FIG. 10, and to swing the water vapor spray nozzle 121a above the rear surface of the silicon substrate W.

It is also conceivable to remove the particles by blowing inert gas such as nitrogen onto the silicon substrate W instead of using the water vapor. However, the inert gas does not have a function to weaken adhesion between the particles and the silicon substrate W. Accordingly, a relatively high flow rate of the inert gas is required for removing the particles sufficiently. However, when blowing a large amount of the inert gas onto the silicon substrate W, the silicon substrate W starts vibrating due to the gas pressure. Such vibration may cause new problems such as scratches on the surfaces of the silicon substrate W, and generation of new particles.

Figure 9C:
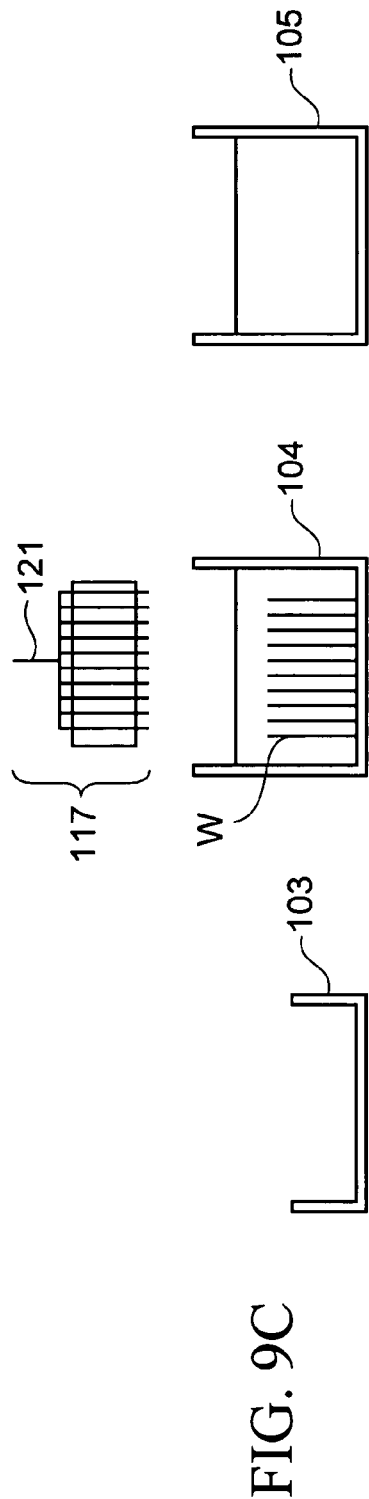

Next, the gripper 117 is taken out of the container 130 as shown in FIG. 9C. Then, the multiple silicon substrates W are collectively dipped into the SPM stored in the first liquid tank 104 for cleaning the silicon substrates W. The process time in the first liquid tank 104 is set in a range from 5 to 10 minutes, for example. During the process, the gripper 117 is retracted upward away from the first liquid tank 104.

Photoresist residues and heavy metals, which are attached onto the surfaces of the silicon substrates W, are removed by dipping the silicon substrates into the SPM as described above.

Moreover, since the particles attached on the rear surfaces of the silicon substrates W are removed in the precedent step (FIG. 9B), the number of the particles brought into the first liquid tank is reduced. Accordingly, it is possible to reduce the number of the particles that might be reattached onto the surfaces of the silicon substrates W.

Figure 9D:
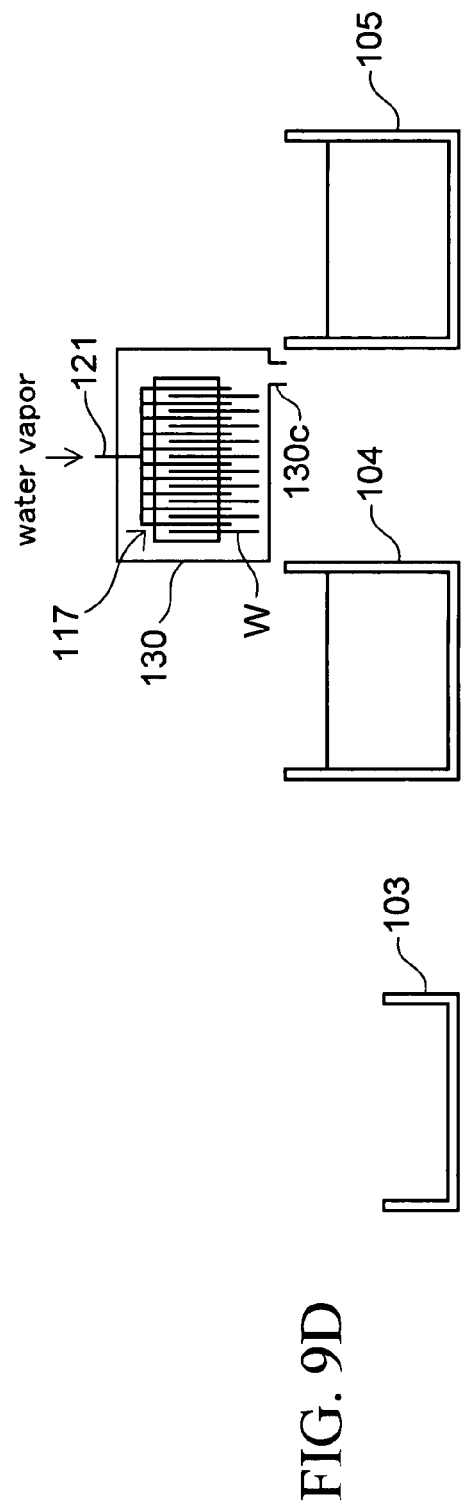

Next, as shown in FIG. 9D, the silicon substrates W are pulled out of the first liquid tank 104 with the gripper 117, and then the gripper 117 is housed again in the container 130.

Thereafter, the heated water vapor is sprayed again out of the water vapor pipe 121 onto the rear surfaces of the silicon substrates W. The water vapor is cooled down on the surfaces of the silicon substrates W, and then is condensed into water droplets. The chemical solution (the SPM) remaining on the surfaces in the first liquid tank 104 is rinsed with the water droplets. Accordingly, it is possible to perform a rinse treatment on the silicon substrates W in this step.

Conditions for this rinse treatment are set up as follows, for instance. Specifically, the flow rate of nitrogen, serving as the carrier gas, is set in a range from 2 to 3 SLM, while the heating temperature by the heater 124 (see FIG. 3) is set in the range from 80° C. to 100° C. Moreover, the process time is set approximately 10 minutes.

In addition, since the particles still remaining on the surfaces of the silicon substrates W are removed by this rinse treatment, it is also possible to reduce the number of particles to be brought into the second liquid tank 105 together with the silicon substrates W.

Subsequently, the gripper 117 is taken out of the container 130 as shown in FIG. 9E. Then, the silicon substrates W are dipped in the deionized water stored in the second liquid tank 105 by use of the gripper 117 and the chemical solution in the first liquid tank 104 remaining on the surfaces of the silicon substrates is completely washed off. The process time is set in a range from 5 to 10 minutes, for example.

Here, the gripper 117 is retracted upward away from the second liquid tank 105 as long as the silicon substrates W are dipped in the second liquid tank 105.

Next, as shown in FIG. 9F, the silicon substrates W are pulled out of the second liquid tank 105 with the gripper 117. Thereafter, the gripper 117 and the silicon substrates W are housed in the container 130.

Subsequently, the following two steps, including rinsing and drying process, are executed in the container 130.

In the first step, the heated water vapor is sprayed again onto the rear surfaces of the silicon substrates W to wash off the chemical solution in the first liquid tank 104 remaining on the surfaces of the silicon substrates W together with the water droplets. At the same time, the surfaces are heated so as to be easily dryable. In this case, the time for spraying the water vapor is set in a range from 3 to 5 minutes and the heating temperature by the heater 124 is set approximately 200° C. Meanwhile, the flow rate of nitrogen serving as the carrier gas is set in a range from 2 to 3 SLM.

In the second step, dry nitrogen is supplied to the water vapor pipe 121 by switching the valves 127 and 128 (see FIG. 3) so as to blow dry nitrogen onto the surfaces of the silicon substrates W. Thus, this dries the silicon substrates W. The flow rate of nitrogen, at this time, is not particularly limited.

However, the flow rate is set approximately 10 SLM in this embodiment. Moreover, the gas to be blown onto the silicon substrates W is not limited to nitrogen as long as it is the inert gas. For example, argon gas may be used instead.

In this way, the principal steps of the substrate processing method of this embodiment are completed.

According to this embodiment, the heated vapor water vapor is sprayed onto the rear surfaces of the silicon substrates W prior to dipping the silicon substrates W into the chemical solution in the first liquid tank 104 as described in FIG. 9B. In this way, adhesion between the particles and the silicon substrates W is weakened. Thus, it is possible to reduce most of the particles attached onto the rear surfaces. Accordingly, it is also possible to reduce the number of the particles to be brought into the first liquid tank 104 together with the silicon substrates W, and thereby to prevent the backside transfer of the particles in the first liquid tank 104.

Moreover, since the number of the particles brought into the first liquid tank 104 by way of the silicon substrates W is decreased, it is possible to reduce the particles in the first liquid tank 104 in a short time by using the CRS 109 (see FIG. 2).

Figure 11:
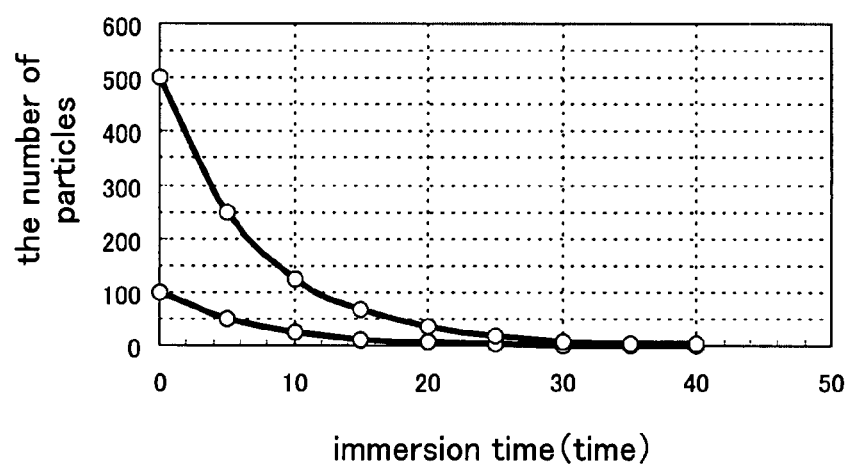
FIG. 11 is a graph obtained by an investigation on immersion time of a silicon substrate and the number of particles in a first liquid tank, in the case of not spraying water vapor.
Figure 12:
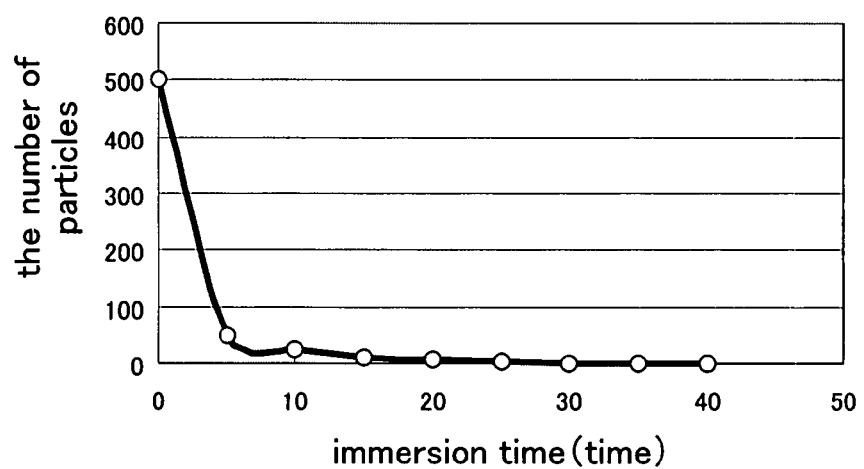
FIG. 12 is a graph obtained by an investigation on immersion time of the silicon substrate and the number of particles in the first liquid tank in the case of spraying water vapor in the embodiment.

FIGS. 11 and 12 are graphs for explaining this advantage.

FIG. 11 is a graph obtained by an investigation on immersion time of the silicon substrate W and the number of particles in the first liquid tank 104 in the case of not spraying the water vapor.

As shown in FIG. 11, in the case where the number of particles originally attached to the silicon substrate W prior to dipping the substrate into the first liquid tank 104 is 500 pieces, a longer time is required for reducing the number of particles as compared to the case in which the number of particles is 100 pieces.

On the other hand, FIG. 12 is a graph obtained by the same investigation in the course of this embodiment.

As shown in FIG. 12, in this embodiment, it is apparent that the number of particles is reduced more quickly than the case shown in FIG. 11 even in the case where the number of particles originally attached to the silicon substrate W prior to spraying the water vapor is 500 pieces. This is attributed to the fact that the number of particles to be brought into the first liquid tank 104 together with the silicon substrate W reduced by spraying the water vapor, and thereby a particle-filtering effect of the CRS 109 is improved as a consequence.

As described above, according to this embodiment, the number of particles in the chemical solution inside the first liquid tank 104 is quickly reduced to the allowable level, even if a large number of particles are attached onto the rear surfaces of the silicon substrates W. Therefore, it is possible to shorten idle time in the substrate processing apparatus 100, and thereby to enhance the throughput of the substrate processing apparatus 100 approximately twice as high as the case of not spraying the water vapor.

In addition, it is not necessary to replace the chemical solution so frequently since the number of particles in the chemical solution is quickly reduced. As a consequence, it is possible to extent lifetime of the chemical solution, and thereby to reduce costs for the chemical solution used therein.

Moreover, the surfaces of the silicon substrates W are dried by use of water vapor and dry nitrogen as described in FIG. 9F. Accordingly, it is not necessary to use a drying tank applying IPA attached to a conventional substrate processing apparatus. Hence, it is possible to reduce the size of the substrate processing apparatus 100.

Moreover, it is also possible to omit a pre-process such as the spin-scrubber process which has conventionally been carried out to remove the particles on the rear surfaces of the silicon substrates W. Accordingly, it is possible to prevent a reduction in a yield attributable to the pre-process, and to reduce the manufacturing costs of semiconductor devices by omitting the pre-process.

Although a certain embodiment has been described above in detail, it should be noted that the present invention will not be limited only to the embodiment expressly stated herein. For example, although the embodiment is configured to perform the process on the silicon substrates W for semiconductor devices by use of the substrate processing apparatus, it is also possible to perform the process on glass substrates for liquid-crystal display devices.

As described above, according to the present invention, particles are removed by spraying vapor onto a rear surface of a substrate prior to dipping the substrate into a liquid. Therefore, it is possible to reduce the number of foreign substances to be brought into a liquid tank, and thereby possible to reduce reattachment of the foreign substances to a front surface of the substrate in the liquid tank.

What is claimed is:

1. A substrate processing method comprising:
generating a heated vapor by a bubbling;
supplying the heated vapor to a vapor spray nozzle;
housing a plurality of substrates in a container, wherein the container is configured to be able to open and close in a bottom thereof, is configured to be able to move along a first area in which a plurality of liquid tanks are provided in a second area arranged in parallel with the first area, and comprises a drain outlet at the bottom thereof;
disposing the vapor spray nozzle in gaps between the plurality of substrates, thereby spraying the heated vapor onto rear surfaces of the plurality of substrates using the vapor spray nozzle after the housing the plurality of substrates in the container;
taking the plurality of substrates out of the container after the spraying of the heated vapor; and
dipping the plurality of substrates collectively into a liquid stored in one of the plurality of liquid tanks after the taking the plurality of substrates out of the container,
wherein, in the generating of the heated vapor, a flow rate of a carrier gas of the bubbling is set in a range from 2 SLM to 3 SLM,
the spraying of the heated vapor is carried out in the state where the plurality of substrates are housed in the container, and
the whole of the container is moved in the second area in mid-course from completion of the housing the plurality of substrates in the container to initiation of the taking the plurality of substrates out of the container.

2. The substrate processing method according to claim 1, wherein water vapor is used as the vapor.

3. The substrate processing method according to claim 1, further comprising:
spraying the heated vapor again onto the respective rear surfaces of the plurality of the substrates in the container after the dipping of the substrate into the liquid; and
introducing inert gas into the container and drying the surfaces of the substrates after the spraying of the heated vapor again.

4. The substrate processing method according to claim 1, further comprising:
performing a rinse treatment on the substrates by spraying the heated vapor again onto the respective rear surfaces of the plurality of substrates after the dipping of the substrates into the liquid.

5. The substrate processing method according to claim 1, wherein the spraying of heated vapor is carried out while the vapor spray nozzle is swung above the rear surfaces of the substrates.

6. The substrate processing method according to claim 1, wherein any of deionized water and a chemical solution is used as the liquid.

7. The substrate processing method according to claim 1, wherein a silicon substrate is used as the substrate.

8. The substrate processing method according to claim 1, wherein a temperature of the heated vapor is set in a range from 80° C. to 100° C.

* * * * *